(12) United States Patent
Kim (10) Patent No.: US 9,311,974 B1
(45) Date of Patent: Apr. 12, 2016

(54) INPUT/OUTPUT STROBE PULSE CONTROL CIRCUIT AND SEMICONDUCTOR MEMORY DEVICE INCLUDING THE SAME

(71) Applicant: SK hynix Inc., Gyeonggi-do (KR)

(72) Inventor: Kyung-Whan Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/656,309

(22) Filed: Mar. 12, 2015

(30) Foreign Application Priority Data

Oct. 21, 2014 (KR) .................... 10-2014-0142359

(51) Int. Cl.
  *G11C 7/00* (2006.01)
  *G11C 7/22* (2006.01)
  *G11C 7/10* (2006.01)
  *G11C 7/06* (2006.01)

(52) U.S. Cl.
  CPC .. *G11C 7/22* (2013.01); *G11C 7/06* (2013.01); *G11C 7/10* (2013.01); *G11C 7/1072* (2013.01)

(58) Field of Classification Search
  USPC ........................................... 365/193, 189.05
  See application file for complete search history.

(56) References Cited

U.S. PATENT DOCUMENTS

| 5,668,774 A * | 9/1997 | Furutani | G11C 7/1033 365/193 |
| 2001/0007539 A1* | 7/2001 | Tanaka | G11C 7/1006 365/230.03 |
| 2004/0044919 A1* | 3/2004 | Dabral | H04L 7/005 713/400 |
| 2014/0016404 A1* | 1/2014 | Kim | G11C 11/165 365/158 |

FOREIGN PATENT DOCUMENTS

KR    1020130072052    7/2013

* cited by examiner

*Primary Examiner* — Anthan Tran
(74) *Attorney, Agent, or Firm* — IP & T Group LLP (57) ABSTRACT

An input/output strobe pulse control circuit includes a control signal generator suitable for generating first to third control signals in response to a column selection enable signal and a first input/output strobe pulse signal, a first latch suitable for generating a second input/output strobe pulse signal in response to the first and second control signals, wherein the second input/output strobe pulse signal is enabled at a failing edge of the column selection enable signal and disabled at a falling edge of the first input/output strobe pulse signal, and a second latch suitable for generating a selection control signal for selectively outputting the first input/output strobe pulse signal or the second input/output strobe pulse signal based on whether the first input/output strobe pulse signal is enabled within an enabling section of the column selection enable signal, in response to the second and third control signals.

15 Claims, 5 Drawing Sheets

INPUT/OUTPUT STROBE PULSE CONTROL CIRCUIT AND SEMICONDUCTOR MEMORY DEVICE INCLUDING THE SAME

CROSS-REFERENCE TO RELATED APPLICATIONS

The present application claims priority of Korean Patent Application No. 10-2014-0142359, filed on Oct. 21, 2014, which is incorporated herein by reference in its entirety.

BACKGROUND

1. Field

Exemplary embodiments of the present invention relate to semiconductor designing technology, and more particularly, to an input/output strobe pulse control circuit for controlling input/output strobe pulses during a read operation, and a semiconductor memory device including the input/output strobe pulse control circuit.

2. Description of the Related Art

Semiconductor memory devices generally amplify cell data in a bit line sense amplifier during a read operation. The amplified cell data are transmitted from the bit line sense amplifier to an input/output sense amplifier through a pair of local input/output lines LIO/LIOB and then amplified again in the input/output sense amplifier to be outputted to an output unit through a global input/output line GIO.

The moment when the data are transmitted from the input/output sense amplifier to the global input/output line GIO is decided based on an input/output strobe pulse signal IOSTBP, which is generated based on a column selection enable signal YI.

Figure 1:
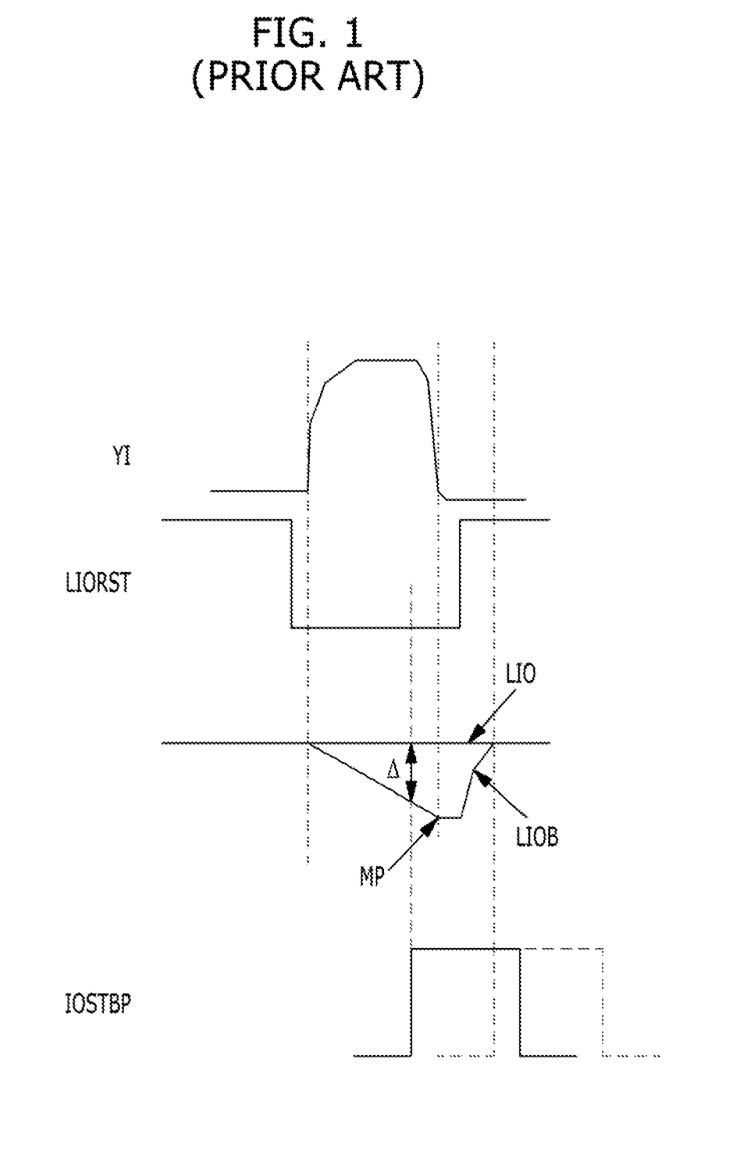
FIG. 1 is a timing diagram illustrating an input/output strobe pulse signal being enabled based on a column selection enable signal.

FIG. 1 is a timing diagram illustrating the input/output strobe pulse signal IOSTBP being enabled based on the column selection enable signal YI.

Referring to FIG. 1, the column selection enable signal YI is enabled and data are loaded on the pair of the local input/output lines LIO/LIOB, individually. The input/output strobe pulse signal IOSTBP may be enabled when the voltage level difference between the local input/output lines LIO/LIOB becomes ΔV, and then the data may be transmitted from the local input/output lines LIO/LIOB to the global input/output line GIO. Subsequently, at the end of the enable section of the column selection enable signal YI, the local input/output lines LIO/LIOB that are developed may be precharged based on a local input/output line reset signal LIORST.

A delay time for outputting the input/output strobe pulse signal IOSTBP is decided based on a simulation result of the semiconductor memory device. However, to secure reliability under the actual operation conditions of the semiconductor memory device, the input/output strobe pulse signal IOSTBP is enabled by adding additional time to the delay time that is calculated through simulations. Also, since the time required to secure sensing margin varies depending on PVT conditions (Process, Voltage and Temperature), the moment when the input/output strobe pulse signal IOSTBP is enabled is set in consideration of the worst possible conditions. Although the input/output strobe pulse signal IOSTBP is delayed due to PVT conditions, the input/output strobe pulse signal IOSTBP gets sufficient time to be enabled within the enabling section of the column selection enable signal YI.

However, as the operation speed of semiconductor memory devices becomes higher and higher, clock frequencies become higher and higher, which narrows the enabling width of the column selection enable signal YI. If the input/output strobe pulse signal IOSTBP is delayed, the input/output strobe pulse signal IOSTBP may be enabled out of the enabling section of the column selection enable signal YI, which is shown in the dotted line in FIG. 1. When the input/output strobe pulse signal IOSTBP is enabled out of the enabling section of the column selection enable signal YI, the local input/output lines LIO/LIOB are precharged in response to the local input/output line reset signal LIORST and it becomes difficult to properly sense the data loaded on the local input/output lines LIO/LIOB.

SUMMARY

An embodiment of the present invention is directed to a semiconductor memory device that may control an input/output strobe pulse signal so that a sensing operation may be performed properly.

In accordance with an embodiment of the present invention, an input/output strobe pulse control circuit may include: a control signal generator suitable for generating first to third control signals in response to a column selection enable signal and a first input/output strobe pulse signal, a first latch suitable for generating a second input/output strobe pulse signal in response to the first and second control signals, wherein the second input/output strobe pulse signal is enabled at a falling edge of the column selection enable signal and disabled at a falling edge of the first input/output strobe pulse signal, and a second latch suitable for generating a selection control signal for selectively outputting the first input/output strobe pulse signal or the second input/output strobe pulse signal based on whether the first input/output strobe pulse signal is enabled within an enabling section of the column selection enable signal, in response to the second and third control signals.

The input/output strobe pulse control circuit may further include: a selector suitable for selectively outputting the first input/output strobe pulse signal or the second input/output strobe pulse signal in response to the selection control signal.

The selector may select and output the first input/output strobe pulse signal based on the selection control signal, when the first input/output strobe pulse signal is enabled within the enabling section of the column selection enable signal.

The selector may select and output the second input/output strobe pulse signal based on the selection control signal, when the first input/output strobe pulse signal is enabled out of the enabling section of the column selection enable signal.

The column selection enable signal may be enabled during a read operation.

The input/output strobe pulse control circuit may further include: a delayer suitable for delaying the column selection enable signal for a predetermined time and generating the first input/output strobe pulse signal.

The first latch may include an SR-latch circuit enabled in response to the first control signal, and disabled in response to the second control signal.

The second latch may include an SR-latch circuit enabled in response to the third control signal, and disabled in response to the second control signal.

The voltage level difference between local input/output lines of a pair may be maximal at the falling edge of the column selection enable signal.

In accordance with another embodiment of the present invention, a semiconductor memory device may include: an input/output strobe pulse generator suitable for generating an initial input/output strobe pulse signal by delaying a column selection enable signal for a predetermined time in response to a delay code; an input/output strobe pulse controller suitable for generating a final input/output strobe pulse signal by controlling the initial input/output strobe pulse signal to be enabled at a falling edge the column selection enable signal, and an input/output sense amplifier suitable for amplifying data of local input/output lines in response to the final input/output strobe pulse signal and transmitting amplified data to a global input/output line.

The input/output strobe pulse controller may include: a control signal generator suitable for generating first to third control signals in response to the column selection enable signal and the initial input/output strobe pulse signal, a first latch suitable for generating the final input/output strobe pulse signal in response to the first and second control signals, wherein the first input/output strobe pulse signal is enabled at a falling edge of the column selection enable signal and disabled at a falling edge of the initial input/output strobe pulse signal, and a second latch suitable for generating a selection control signal for selectively outputting the initial input/output strobe pulse signal or the final input/output strobe pulse signal based on whether the initial input/output strobe pulse signal is enabled at the falling edge of the column selection enable signal, in response to the second and third control signals.

The input/output strobe pulse controller may further include: a selector suitable for selectively outputting the initial input/output strobe pulse signal or the final input/output strobe pulse signal in response to the selection control signal.

The column selection enable signal may be enabled during a read operation.

The first latch may include an SR-latch circuit enabled in response to the first control signal, and disabled in response to the second control signal.

The second latch may include an SR-latch circuit enabled in response to the third control signal, and disabled in response to the second control signal.

The voltage level difference between the local input/output lines of a pair may be maximal at the falling edge of the column selection enable signal.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

When an element is referred to as being connected or coupled to another element, it should be understood that the former can be directly connected or coupled to the latter, or electrically connected or coupled to the latter via an intervening element therebetween. Furthermore, when it is described that one "comprises" (or "includes") or "has" some elements, it should be understood that it may comprise (or include) or has only those elements, or it may comprise (or include) or have other elements as well as those elements if there is no specific limitation mentioned. The terms of singular form may include plural forms unless referred to the contrary.

Figure 2:
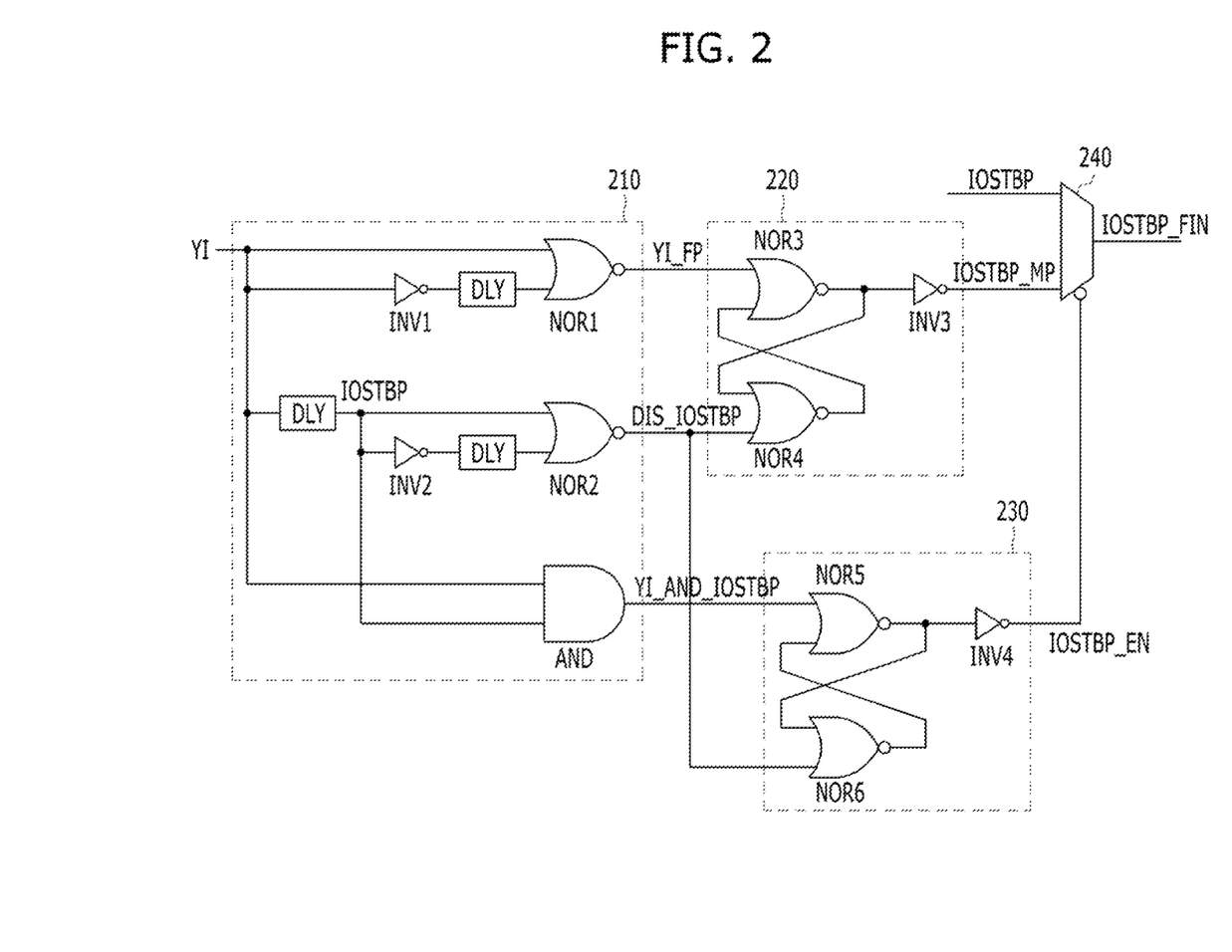
FIG. 2 is a circuit diagram illustrating an input/output strobe pulse control circuit of a semiconductor memory device in accordance with an embodiment of the present invention.

FIG. 2 is a circuit diagram illustrating an input/output strobe pulse control circuit of a semiconductor memory device in accordance with an embodiment of the present invention.

Referring to FIG. 2, the input/output strobe pulse control circuit may include a control signal generator 210, a first latch 220, a second latch 230, and a selector 240.

The control signal generator 210 may generate first to third control signals YI_FP, DIS_IOSTBP and YI_AND_IOSTBP in response to a column selection enable signal YI. The first control signal YI_FP is enabled at the falling edge of the column selection enable signal YI, which is a moment when the enabled column selection enable signal YI is disabled. The first control signal YI_FP may be generated by inverting the column selection enable signal YI in an inverter INV1, delaying the inverted column selection enable signal in a delayer DLY for a predetermined time, and performing a logic operation on the delayed signal and the column selection enable signal YI in a NOR gate NOR1. The second control signal DIS_IOSTBP is enabled at the falling edge of a first input/output strobe pulse signal IOSTBP, which is a moment when the enabled first input/output strobe pulse signal IOSTBP is disabled. The enabled first input/output strobe pulse signal IOSTBP is generated by delaying the column selection enable signal YI in the delayer DLY for a predetermined time. The second control signal DIS_IOSTBP may be generated by inverting the first input/output strobe pulse signal IOSTBP in an inverter INV2, delaying the inverted first input/output strobe pulse signal for a predetermined time, and performing a logic operation on the delayed signal and the first input/output strobe pulse signal IOSTBP in a NOR gate NOR2. The third control signal YI_AND_IOSTBP is enabled in a section where both of the column selection enable signal YI and the first input/output strobe pulse signal IOSTBP are enabled. The third control signal YI_AND_IOSTBP may be generated by performing a logic operation on the column selection enable signal YI and the first input/output strobe pulse signal IOSTBP in an AND gate AND.

The first latch 220 may generate a second input/output strobe pulse signal IOSTBP_MP in response to the first control signal YI_FP and the second control signal DIS_IOSTBP. The second input/output strobe pulse signal IOSTBP_MP is enabled in response to the first control signal YI_FP, and disabled in response to the second control signal DIS_IOSTBP. In short, the second input/output strobe pulse signal IOSTBP_MP may be enabled from a moment when the column selection enable signal YI is disabled. The first latch 220 may include an SR-latch circuit that is formed of two NOR gates NOR3 and NOR4, and one inverter INV3.

The second latch 230 may generate a selection control signal IOSTBP_EN for selecting the first input/output strobe pulse signal IOSTBP or the second input/output strobe pulse signal IOSTBP_MP in response to the third control signal YI_AND_IOSTBP and the second control signal DIS_IOSTBP. The selection control signal IOSTBP_EN is enabled in response to the third control signal YI_AND_IOSTBP, and disabled in response to the second control signal DIS_IOSTBP. In short, when the first input/output strobe pulse signal IOSTBP is enabled within the enabling section of the column selection enable signal YI, the selection control signal IOSTBP_EN is enabled. When the first input/output strobe pulse signal IOSTBP is enabled out of the enabling section of the column selection enable signal YI, the selection control signal IOSTBP_EN may continue to be disabled. The second latch 230 may include an SR-latch circuit that is formed of two NOR gates NOR5 and NOR6, and one inverter INV4.

The selector 240 may selectively output the first input/output strobe pulse signal IOSTBP or the second input/output strobe pulse signal IOSTBP_MP in response to the selection control signal IOSTBP_EN. When the level of the selection control signal IOSTBP_EN has a logic high value, the first input/output strobe pulse signal IOSTBP is selected and outputted as a final input/output strobe pulse signal IOSTBP_FIN. When the level of the selection control signal IOSTBP_EN has a logic low value, the second input/output strobe pulse signal IOSTBP_MP is selected and outputted as the final input/output strobe pulse signal IOSTBP_FIN.

In other words, the selection control signal IOSTBP_EN may select the first input/output strobe pulse signal IOSTBP or the second input/output strobe pulse signal IOSTBP_MP based on whether the first input/output strobe pulse signal IOSTBP is enabled within the enabling section of the column selection enable signal YI or out of the enabling section of the column selection enable signal YI. The first input/output strobe pulse signal IOSTBP being enabled within the enabling section of the column selection enable signal YI signifies that the first input/output strobe pulse signal IOSTBP is enabled when the sensing operation may be performed properly. Therefore, the sensing operation may be performed properly based on the initially enabled first input/output strobe pulse signal IOSTBP. In contrast, the first input/output strobe pulse signal IOSTBP being enabled out of the enabling section of the column selection enable signal YI signifies that the first input/output strobe pulse signal IOSTBP is enabled when the sensing operation cannot be performed properly. Therefore, the second input/output strobe pulse signal IOSTBP_MP may be selected to perform the sensing operation when the column selection enable signal YI is disabled, which is when the voltage level difference between the local input/output lines LIO/LIOB are maximally amplified.

Figure 3:
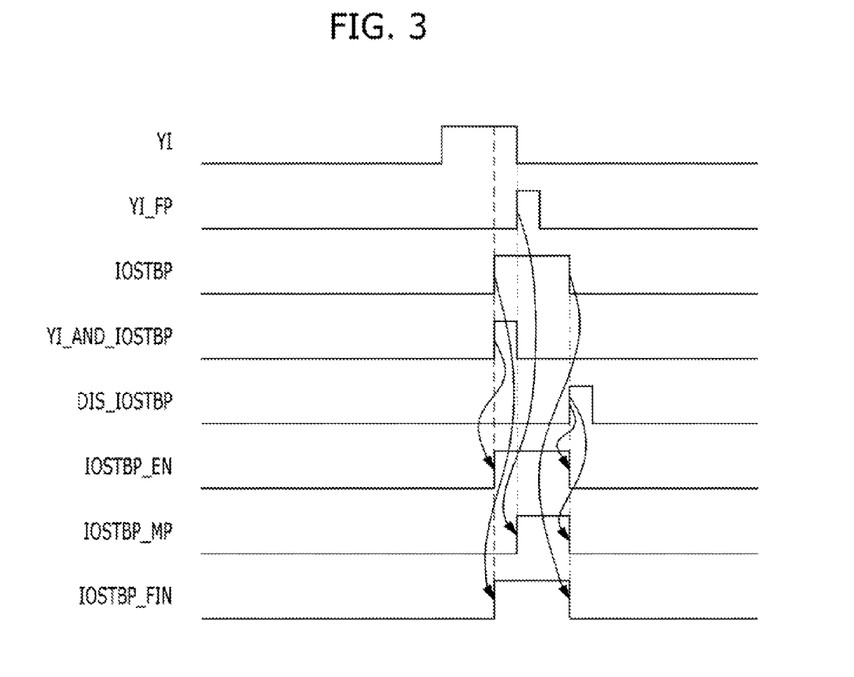
FIG. 3 is a timing diagram illustrating an input/output strobe pulse signal being enabled properly.

FIG. 3 is a timing diagram illustrating an input/output strobe pulse signal being enabled properly.

Referring to FIGS. 2 and 3, after the column selection enable signal YI is enabled, the first input/output strobe pulse signal IOSTBP that is generated by delaying the column selection enable signal YI in the delayer DLY for a predetermined time is enabled. Since the first input/output strobe pulse signal IOSTBP is properly enabled to overlap with the enabling section of the column selection enable signal YI, the third control signal YI_AND_IOSTBP may be enabled. For this reason, the selection control signal IOSTBP_EN may be enabled, and the first input/output strobe pulse signal IOSTBP may be outputted as the final input/output strobe pulse signal IOSTBP_FIN. In other words, although the second input/output strobe pulse signal IOSTBP_MP is generated based on the first control signal YI_FP, which is generated when the column selection enable signal YI is disabled, and the second control signal DIS_IOSTBP, which is generated when the first input/output strobe pulse signal IOSTBP is disabled, the first input/output strobe pulse signal IOSTBP is enabled within the enabling section of the column selection enable signal YI. Therefore, the sensing operation may be performed based on the enabled first input/output strobe pulse signal IOSTBP.

Figure 4:
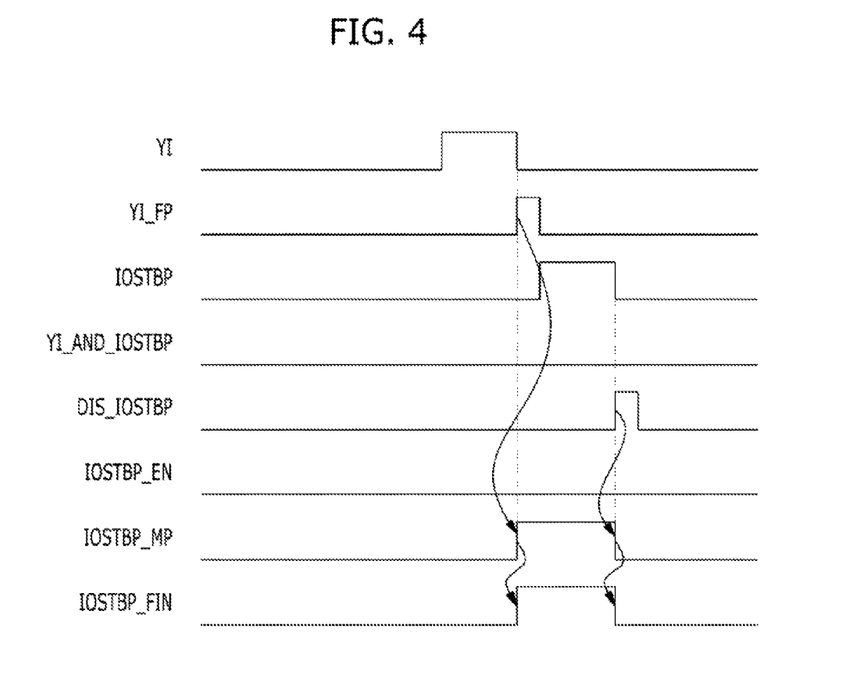
FIG. 4 is a timing diagram illustrating an input/output strobe pulse signal being enabled behind an enabling section of a column selection enable signal.

FIG. 4 is a timing diagram illustrating an input/output strobe pulse signal being enabled behind an enabling section of a column selection enable signal.

Referring to FIGS. 2 and 4, after the column selection enable signal YI is enabled, the first input/output strobe pulse signal IOSTBP is enabled behind the enabling section of the column selection enable signal YI. Therefore, the third control signal YI_AND_IOSTBP that is enabled in a section where the column selection enable signal YI and the first input/output strobe pulse signal IOSTBP are enabled simultaneously is maintained in a logic low level at all times, and thus the selection control signal IOSTBP_EN may be maintained in a logic low level as well. Therefore, the second input/output strobe pulse signal IOSTBP_MP may be generated based on the first control signal YI_FP and the second control signal DIS_IOSTBP. The first control signal YI_FP is enabled at the moment when the enabled column selection enable signal YI is disabled, and the second control signal DIS_IOSTBP is enabled at the moment when the enabled first input/output strobe pulse signal IOSSTBP is disabled. In other words, the second input/output strobe pulse signal IOSTBP_MP is enabled when the first control signal YI_FP is enabled, and disabled when the second control signal DIS_IOSTBP is disabled. Since the selection control signal IOSTBP_EN is in a logic low level, the second input/output strobe pulse signal IOSTBP_MP may be outputted as the final input/output strobe pulse signal IOSTBP_FIN and used to perform the sensing operation. In short, the sensing operation may be controlled to be performed properly by enabling the second input/output strobe pulse signal IOSTBP_MP when the column selection enable signal YI is disabled.

Since the column selection enable signal YI is disabled when the voltage level difference between the local input/output lines LIO/LIOB is maximal, the sensing operation may be performed properly.

Figure 5:
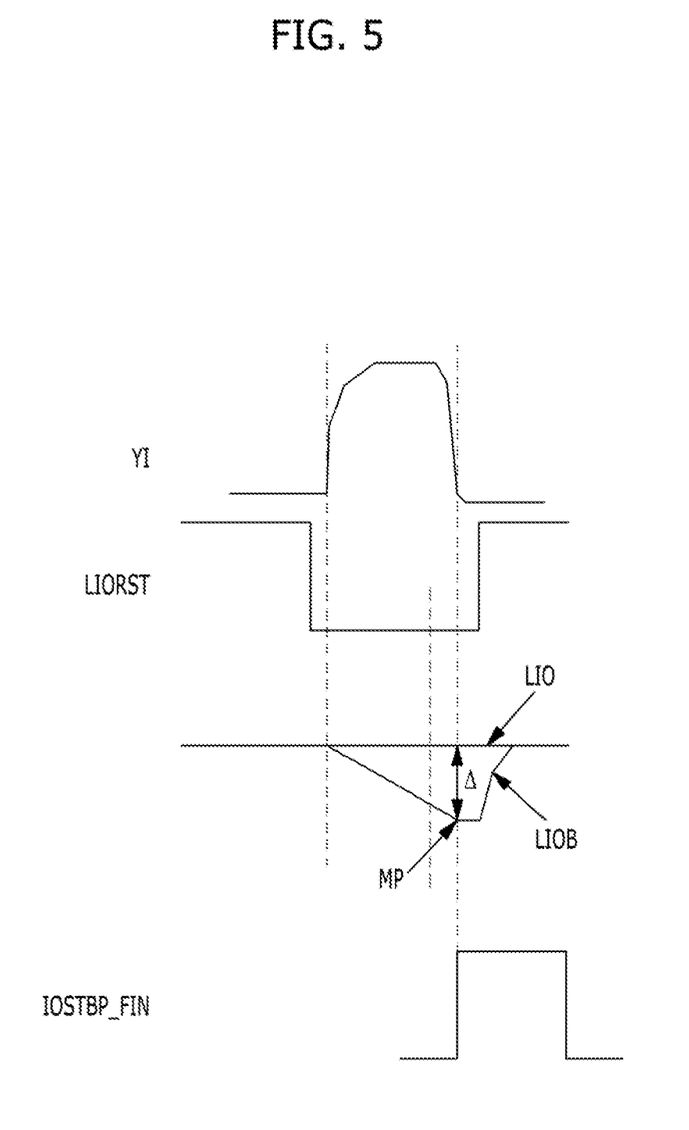
FIG. 5 is a timing diagram illustrating an input/output strobe pulse signal being enabled when a column selection enable signal is disabled.

FIG. 5 is a timing diagram illustrating an input/output strobe pulse signal being enabled when a column selection enable signal is disabled.

Referring to FIG. 5, the column selection enable signal YI is enabled and data are loaded on the local input/output lines LIO/LIOB. The final input/output strobe pulse signal IOSTBP_FIN may then be enabled when the voltage level difference ΔV between the local input/output lines LIO/LIOB is maximal (MP), which is when the column selection enable signal YI is disabled. The purpose of this is to enable the second input/output strobe pulse signal IOSTBP_MP through an internal control when the column selection enable signal YI is disabled and the first input/output strobe pulse signal IOSTBP is enabled behind the enabling section of the column selection enable signal YI. Therefore, since the final input/output strobe pulse signal IOSTBP_FIN is enabled when the voltage level difference ΔV between the local input/output lines LIO/LIOB is maximal (MP), the data loaded on the local input/output lines LIO/LIOB may be sensed properly.

Figure 6:
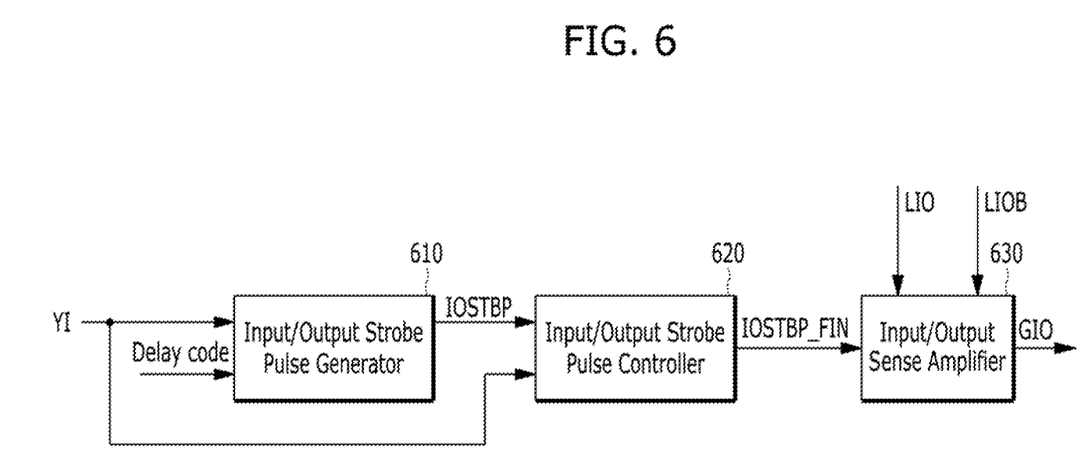
FIG. 6 is a block diagram illustrating a semiconductor memory device in accordance with an embodiment of the present invention.

FIG. 6 is a block diagram illustrating a semiconductor memory device in accordance with an embodiment of the present invention.

Referring to FIG. 6, the semiconductor memory device may include an input/output strobe pulse generator 610, an input/output strobe pulse controller 620, and an input/output sense amplifier 630.

The input/output strobe pulse generator 610 may generate an initial input/output strobe pulse signal IOSTBP by delaying a column selection enable signal YI for a predetermined time in response to a delay code. The delay code may correspond to the delayer DLY for generating the first input/output strobe pulse signal IOSTBP shown in FIG. 2, and the initial input/output strobe pulse signal IOSTBP may correspond to the first input/output strobe pulse signal IOSTBP shown in FIG. 2.

The input/output strobe pulse controller 620 may generate a final input/output strobe pulse signal IOSTBP_FIN by controlling the initial input/output strobe pulse signal IOSTBP to be enabled when the column selection enable signal YI is disabled (falling edge). The initial input/output strobe pulse signal IOSTBP is enabled after being delayed for a predetermined time based on the delay code. If the initial input/output strobe pulse signal IOSTBP is delayed more than the time based on the delay code due to PVT conditions (Process, Voltage and Temperature), the initial input/output strobe pulse signal IOSTBP may be enabled out of the enabling section of the column selection enable signal YI. In this case, the initial input/output strobe pulse signal IOSTBP may be enabled in a section where the voltage level difference between the local input/output lines LIO/LIOB becomes '0', and a sensing operation may not be performed properly. Therefore, when the initial input/output strobe pulse signal IOSTBP is delayed more than the time based on the delay code due to PVT conditions (Process, Voltage and Temperature), the initial input/output strobe pulse signal IOSTBP may be controlled to be enabled when the column selection enable signal YI is disabled so that the final input/output strobe pulse signal IOSTBP_FIN may be outputted.

The input/output strobe pulse generator 610 and the Input/output strobe pulse controller 620 may correspond to the input/output strobe pulse control circuit shown in FIG. 2.

Also, although the column selection enable signal YI is delayed for a predetermined time to generate the initial input/output strobe pulse signal IOSTBP in the embodiments of the present invention, it is also possible to receive the initial input/output strobe pulse signal IOSTBP from an external device, such as a memory controller.

The input/output sense amplifier 630 may amplify the data of the local input/output lines LIO/LIOB in response to the final input/output strobe pulse signal IOSTBP_FIN and transmit the amplified data to a global input/output line GIO.

To sum up, as semiconductor memory devices perform high-speed operations, the pulse width of the column selection enable signal YI may narrow, and the moment when the initial input/output strobe pulse signal IOSTBP that is enabled in response to the column selection enable signal YI may be advanced or delayed due to PVT conditions. When the input/output strobe pulse signal IOSTBP is enabled out of the enabling section of the column selection enable signal YI, it may be difficult for the input/output sense amplifier 630 to properly sense the data loaded on the local input/output lines LIO/LIOB. Therefore, the semiconductor memory device in accordance with the embodiment of the present invention may control the input/output strobe pulse signal IOSTBP to be enabled when the column selection enable signal YI is disabled in order to sense the data when the voltage level difference between the local input/output lines LIO and LIOB is maximal.

Therefore, the semiconductor memory device in accordance with the embodiment of the present invention may control the input/output strobe pulse signal IOSTBP to be enabled when the column selection enable signal YI is disabled, although the input/output strobe pulse signal IOSTBP is delayed due to the PVT conditions and thereby perform sensing operations properly at all times.

According to the embodiments of the present invention, when the pulse width of a column selection enable signal narrows due to high-speed operation and an input/output strobe pulse signal is delayed due to PVT conditions (Process, Voltage and Temperature), an input/output strobe pulse control circuit performs a control to enable the input/output strobe pulse signal when the column selection enable signal is disabled so that sensing operations may be performed properly all the times.

While the present invention has been described with respect to specific embodiments, it will be apparent to those skilled in the art that various changes and modifications may be made without departing from the spirit and scope of the invention as defined in the following claims.

What is claimed is:

1. An input/output strobe pulse control circuit, comprising:
   a control signal generator configure to generate first to third control signal's in response to a column selection enable signal and a first input/output strobe pulse signal;
   a first latch configure to generate a second input/output strobe pulse signal based on the first and second control signals, wherein the second input/output strobe pulse signal is enabled at a failing edge of the column selection enable signal and disabled at a falling edge of the first input/output strobe pulse signal; and
   a second latch suitable for generating a selection control signal for selectively outputting the first input/output strobe pulse signal or the second input/output strobe pulse signal based on whether the first input/output strobe pulse signal is enabled within an enabling section of the column selection enable signal, based on the second and third control signals.

2. The input/output strobe pulse control circuit of claim 1 further comprising:
   a selector configure to selectively outputting the first input/output strobe pulse signal or the second input/output strobe pulse signal based on the selection control signal.

3. The input/output strobe pulse control circuit of claim 2, wherein the selector selects and outputs the first input/output strobe pulse signal based on the selection control signal, when the first input/output strobe pulse signal is enabled within the enabling section of the column selection enable signal.

4. The input/output strobe pulse control circuit of claim 2, wherein the selector selects and outputs the second input/output strobe pulse signal based on the selection control signal, when the first input/output strobe pulse signal is enabled out of the enabling section of the column selection enable signal.

5. The input/output strobe pulse control circuit of claim 1, wherein the column selection enable signal is enabled during a read operation.

6. The input/output strobe pulse control circuit of claim 1, further comprising:
   a delayer configure to delay the column selection enable signal for a predetermined time and generating the first input/output strobe pulse signal.

7. The input/output strobe pulse control circuit of claim 1, wherein the first latch includes:
   an SR-latch circuit enabled based on the first control signal, and disabled based on the second control signal.

8. The input/output strobe pulse control circuit of claim 1, wherein the second latch includes:
   an SR-latch circuit enabled based on the third control and disabled based on the second control signal.

9. The input/output strobe pulse control circuit of claim 1, wherein a voltage level difference between a pair of local input/output lines is maximal at the falling edge of the column selection enable signal.

10. A semiconductor memory device, comprising:
   an input/output strobe pulse generator configure to generate an initial input/output strobe pulse signal by delaying a column selection enable signal for a predetermined time based on a delay code;
   an input/output strobe pulse controller configure to generate a final input/output strobe pulse signal by controlling the initial input/output strobe pulse signal to be enable at a falling edge of the column selection enable signal; and
   an input/output sense amplifier configure to amplify data of local input/output lines based on the final input/output strobe pulse signal and transmitting amplified data to a global input/output line; and
   wherein the input/output strobe pulse controller includes:
   a control signal generator configure to generate first to third control signals based on the column selection enable signal and the initial input/output strobe pulse signal;
   a first latch configure to generate the final input/output strobe pulse signal based on the first and second control signals, wherein the first input/output strobe pulse signal is enabled at a falling edge of the column selection enable signal and disable at a falling edge of the initial input/output strobe pulse signal; and
   a second latch configure to generate a selection control signal for selectively outputting the initial input/output strobe pulse signal or the final input/output strobe pulse signal based on whether the initial input/output strobe pulse signal is enabled at the falling edge of the column selection enable signal, based on the second and third control signals.

11. The semiconductor memory device of claim 10, wherein the input/output strobe pulse controller further includes:
   a selector configure to selectively outputting the initial input/output strobe pulse signal or the final input/output strobe pulse signal based on the selection control signal.

12. The semiconductor memory device of claim 10, wherein the column selection enable signal is enabled during a read operation.

13. The semiconductor memory device of claim 10, wherein the first latch includes:
   an SR-latch circuit enabled based on the first control signal, and disabled based on the second control signal.

14. The semiconductor memory device of claim 10, wherein the second latch includes:
   an SR-latch circuit enabled based on the third control signal, and disabled based on the second control signal.

15. The semiconductor memory device of claim 8, wherein a voltage level difference between a pair of local input/output lines is maximal at the falling edge of the column selection enable signal.

* * * * *